United States Patent [19]

Mistretta et al.

[11] Patent Number: 5,713,358
[45] Date of Patent: Feb. 3, 1998

[54] METHOD FOR PRODUCING A TIME-RESOLVED SERIES OF 3D MAGNETIC RESONANCE ANGIOGRAMS DURING THE FIRST PASSAGE OF CONTRAST AGENT

[75] Inventors: Charles A. Mistretta; Frank R. Korosec; Thomas M. Grist; Richard Frayne; Jason A. Polzin, all of Madison, Wis.

[73] Assignee: Wisconsin Alumni Research Foundation, Madison, Wis.

[21] Appl. No.: 622,718

[22] Filed: Mar. 26, 1996

[51] Int. Cl.⁶ .................................................. A61B 5/055
[52] U.S. Cl. ................................. 128/653.2; 128/653.3; 324/306; 324/309
[58] Field of Search .............................. 128/653.2, 653.3; 324/307, 309, 312, 306

[56] References Cited

U.S. PATENT DOCUMENTS

| | | | |
|---|---|---|---|
| 4,204,225 | 5/1980 | Mistretta | 358/111 |
| 4,204,226 | 5/1980 | Mistretta | 358/111 |
| 4,417,213 | 11/1983 | Prince | 128/653.3 |
| 4,830,012 | 5/1989 | Riederer | 128/653 |
| 4,918,396 | 4/1990 | Dumoulin et al. | |
| 4,986,272 | 1/1991 | Riederer et al. | |
| 5,166,875 | 11/1992 | Machida | |
| 5,204,627 | 4/1993 | Mistretta et al. | |
| 5,303,706 | 4/1994 | Moshfeghi | |
| 5,348,011 | 9/1994 | NessAiver | |
| 5,377,680 | 1/1995 | Bernstein et al. | 128/653.2 |
| 5,417,213 | 5/1995 | Prince | 128/655.3 |
| 5,435,303 | 7/1995 | Bernstein et al. | |
| 5,474,067 | 12/1995 | Laub | 128/653.2 |
| 5,485,086 | 1/1996 | Meyer et al. | 324/307 |
| 5,498,961 | 3/1996 | Kuhn et al. | 324/309 |
| 5,553,619 | 9/1996 | Prince | |

FOREIGN PATENT DOCUMENTS

| | | |
|---|---|---|
| 0 599 456 A1 | 1/1994 | European Pat. Off. |
| 0 615 135 A1 | 9/1994 | European Pat. Off. |
| 43 17 028 A1 | 11/1994 | Germany |
| 43 27 325 C1 | 12/1995 | Germany |
| 405329126 | 12/1993 | Japan |
| 406000170 | 1/1994 | Japan |
| 406169896 | 6/1994 | Japan |

OTHER PUBLICATIONS

Block Regional Interpolation Scheme for k–Space (BRISK): A Rapid Cardiac Imaging Technique, MRM 33:163–170 (1995), Doyle et al.

Dynamic Three–Dimensional Imaging with Partial K–Space Sampling: Initial Application for Gadolinium–enhanced Rate Characterization of Breast Lesions, Radiology 1995; 196:135–142, Chenevert, et al.

Magnetic Resonance Fluoroscopy Using Spirals with Variable Sampling Densities, MRM 34:388–394 (1995), Spielman, et al.

*Improved Ejection Fraction and Flow Velocity Estimates with Use of View Sharing and Uniform Repetition Time Excitation with Fast Cardiac Techniques*, Radiology 1995; 195:471–478, Foo et al.

*Block Regional Interpolation Scheme for k–Space (BRISK): A Rapid Cardiac Imaging Technique*, MRM 33:163–170 (1995), Doyle, et al.

*Breath–hold Cine MR Imaging with a Shared and Reordered Gradient Echo Technique*, Siemens Medical Engineering, Erlangen, Germany, p. 478.

(List continued on next page.)

*Primary Examiner*—Marvin M. Lateef
*Assistant Examiner*—Shawna J. Shaw
*Attorney, Agent, or Firm*—Quarles & Brady

[57] ABSTRACT

A dynamic MRA study of a subject is performed using a 3D fast gradient-recalled echo pulse sequence. The frame rate of the resulting series of reconstructed images is increased by sampling a central region of k-space at a higher rate than the peripheral regions of k-space. Image frames are reconstructed at each sampling of the central k-space region using the temporally nearest samples from the peripheral k-space regions.

23 Claims, 5 Drawing Sheets

OTHER PUBLICATIONS

*MR Fluoroscopy: Technical Feasibility*, MRM 8, 1–15 (1988), Riederer, et al.

*Method for Accelerated Perfusion Imaging*, van Vaals, et al., p. 1139.

*Simulation of Spatial and Contrast Distortions in Keyhole Imaging*, MRM 31:320–322 (1994), Spraggins.

Paper by: J.O. Frederickson & N.J. Pelc, Dept. of Radiology, Stanford University, Stanford CA.

*Dynamic Gadolinium–enhanced Three–dimensional Abdominal MR Arteriography*, JMRI 1993: 3:877–881, vol. 3, No. 6, Prince et al.

*Dynamic, contrast enhanced, NMR perfusion imaging of regional cerebral ischaemia in rats using k space substitution*, Jones et al., p. 1138.

*Reduction of Field of View for Dynamic Imaging*, MRM 31:691–694 (1994), Hu et al.

*K–Space Substitution: A Novel Dynamic Imaging Technique*, MRM 29:830–834 (1993), Jones, et al.

*Dynamic Susceptibility Contrast Imaging Using A Gradient–Echo Sequence*, Radiology Science Lab, Dept. of Radiology, Stanford CA, Pike, et al.

*Real–Time MR Fluoroscopic Data Acquisition and Image Reconstruction*, MRM 12, 407–415 (1989), Wright et al.

*Continuous Update with Random Encoding (CURE): A New Strategy for Dynamic Imaging*, MRM 33:326–336 (1995), Parrish, et al.

*New Strategies in Spiral MR Fluoroscopy*, Dept. of Electrical Engineering, Stanford University, Stanford CA, Keer, et al.

Paper by: J. Polzin, et al., Dept. of Medical Physics & Radiology, University of Wisconsin, Madison WI.

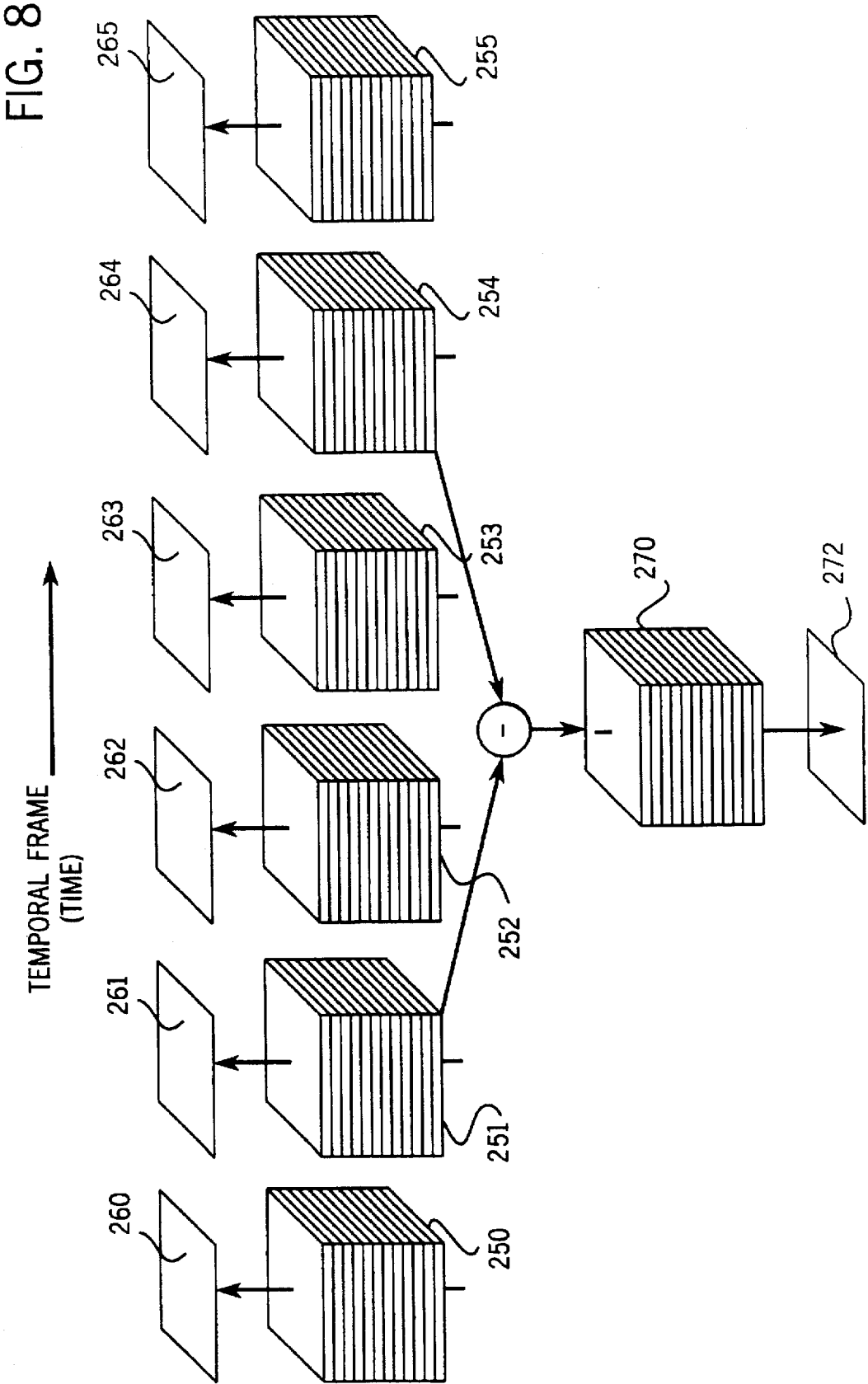

METHOD FOR PRODUCING A TIME-RESOLVED SERIES OF 3D MAGNETIC RESONANCE ANGIOGRAMS DURING THE FIRST PASSAGE OF CONTRAST AGENT

This invention was made with United States Government support awarded by NIH; NIH Award numbers HL02848 and CA58521. The United States Government has certain rights in this invention.

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time to seconds rather than minutes is the major obstacle in performing clinical dynamic studies using MRI methods. The most common MRI method currently used for non-triggered, time-resolved imaging is to use an echo-planar imaging ("EPI") pulse sequence such as that first described by Peter Mansfield (J. Phys. C. 10: L55–L58, 1977). In principle the EPI scan enables imaging of dynamic process occurring with periods measured on the order of a few hundred milliseconds. However, time-resolved EPI is otherwise un-suitable for contrast enhanced MRA because it exhibits a low contrast between blood and surrounding tissues due to the long time intervals (e.g. 100 ms) between RF excitations. EPI also has enhanced sensitivity to a variety of flow-related artifacts, and EPI images can be blurred due to $T_2^*$-modulation of k-space.

A number of methods have been developed to increase the temporal resolution of MRI scans using pulse sequences that are applicable to MRA. In a method known in the art as "MR fluoroscopy" and described in U.S. Pat. No. 4,830,012, the subject is scanned by continuously and repeatedly acquiring the N phase encoding views needed for a complete image. Rather than waiting for an entirely new set of N views before reconstructing the next image, however, images are reconstructed at a much higher rate by using the most recent N views. In other words, an image is reconstructed from newly acquired views as well as views used in reconstructing previous images in the dynamic study. While very high temporal rates are achieved with MR fluoroscopy, the image contrast is not satisfactory for MRA because the central views in k-space, which dominate the overall image contrast, are still updated at the much slower inherent scan rate (i.e. NxTR).

Another method for increasing temporal resolution of MRI images is referred to in the art as "keyhole" imaging. As described, for example, by R. A. Jones, et al. in "Dynamic, Contrast Enhanced, NMR Perfusion Imaging Of Regional Cerebral Ischaemia In Rats Using K-Space Substitution", *SMR Eleventh Annual Meeting* 1992 abs. 1138, a sequence of images is acquired during a dynamic study in which a contrast agent is injected in the subject. The first image in the sequence is a reference image in which all the phase encoding views (e.g. 128 views) are acquired. Subsequent images are produced, however, by only acquiring the central views (e.g. the central 32 views). These keyhole scans can obviously be acquired much faster than complete scans and the temporal rate is increased proportionately. The keyhole images are reconstructed using the most recent central k-space views combined with the outer, peripheral k-space views from the reference scan. Unfortunately, in situations where the low spatial frequency changes in the reconstructed images do not capture the evolution of the dynamic study, k-space keyhole imaging is not appropriate. This is a problem when contrast changes in small regions are to be studied, and in such studies the number of central views acquired must be increased to the point where the gain in temporal resolution is lost.

Related to the k-space keyhole imaging method is a method known in the art as limited field of view ("FOV") dynamic imaging. As described, for example, by Hu and Parrish, published in *Magnetic Resonance in Medicine*, Vol. 31, pp. 691–694, 1994, and by Frederickson and Pelc, 3rd SMR, 1, 197.1995; this method is applied to dynamic studies in which the changing part of the image occupies no more than one half the full FOV. A reference image representing the static part of the image is produced at the beginning of the study and a series of images encompassing only the dynamic, central portion of the image are produced using half the number of phase encoding views. These dynamic images can be acquired at a higher temporal rate because only half the number of views (either the odd or even views) need be acquired. The dynamic and static portions of the image are combined to produce a corresponding series of full FOV images. Of course, if changes occur in the static portion of the image, the information obtained from these regions will no longer accurately remove artifacts aliased into the small FOV.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. This is know as flow-related enhancement, but this effect is misnamed because the improvement in blood-tissue contrast is actually due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images. Phase contrast MRA techniques have been extended so that they are sensitive to velocity components in all three orthogonal directions.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. As described in U.S. Pat. No. 5,417,213 the trick is to acquire the central k-space views at the moment the bolus of contrast agent is flowing through the vasculature of interest. This is not an easy timing to achieve as part of a routine clinical procedure.

SUMMARY OF THE INVENTION

The present invention is a method for increasing the temporal rate at which MRI images can be acquired during a dynamic study. More specifically, the method includes repeatedly acquiring samples from a selected k-space during a dynamic study, sampling a central region of the selected k-space at a higher temporal rate than the sampling of surrounding k-space regions during the dynamic study, forming a data set for each set of central region k-space samples which includes the central region k-space samples and samples derived from the most temporally adjacent samplings of the surrounding k-space regions, and reconstructing an MRI image from each of the data sets to produce a sequence of images at the higher temporal rate. The samples in each data set which are derived from samples of surrounding k-space regions may be derived simply by selecting the corresponding k-space samples acquired closest in time to the acquisition of the central region k-space samples, or they may be derived by interpolating between corresponding k-space samples acquired before and after the acquisition of the central region k-space samples.

A general object of the invention is to increase the temporal rate at which MRI images can be produced during a dynamic study without reducing their diagnostic value. By sampling the central k-space region at a higher temporal rate, the dynamic changes in contrast of the larger objects in the subject are finely resolved. Using a lower sampling rate for the peripheral k-space regions substantially reduces the amount of data to be acquired per image frame without significantly reducing the diagnostic value of the reconstructed image. The advantages are particularly pronounced with 3D acquisitions.

Another object of the invention is to provide a method in which the temporal rate can be further increased by using small FOV imaging techniques. Use of the present invention does not preclude the use of this and other techniques for increasing the frame rate in a dynamic study. In addition, the higher temporal image frame rate achieved with the present invention enables an image to be produced by subtracting two image frames. This removes aliasing artifacts associated with the small FOV imaging method.

Another object of the invention is to provide a method in which the temporal rate can be further increased by producing interpolated images formed by interpolating between successive data sets. The basic frame rate as determined by the rate at which the central k-space region is sampled can be increased by interpolating between successive samples to form image frames therebetween.

Another object of the invention is to produce an angiogram with reduced artifacts by calculating the difference between two of the MRI image frames. By acquiring a series of image frames during a dynamic study various image enhancement methods can be employed by using data from two or more image frames in the series.

Yet another object of the invention is to produce an improved magnetic resonance angiogram by acquiring data from a three-dimensional region. The reconstructed 3D MRI image frames can be projected into a 2D plane using methods which significantly increase their diagnostic value. A similar projection can be used on a 3D difference image formed by subtracting two of said 3D MRI image frames.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 8 is a pictorial representation of the data sets for each image frame in the dynamic study and how they are combined to produce an MRA image.

DESCRIPTION OF THE PREFERRED EMBODIMENT

Figure 1:
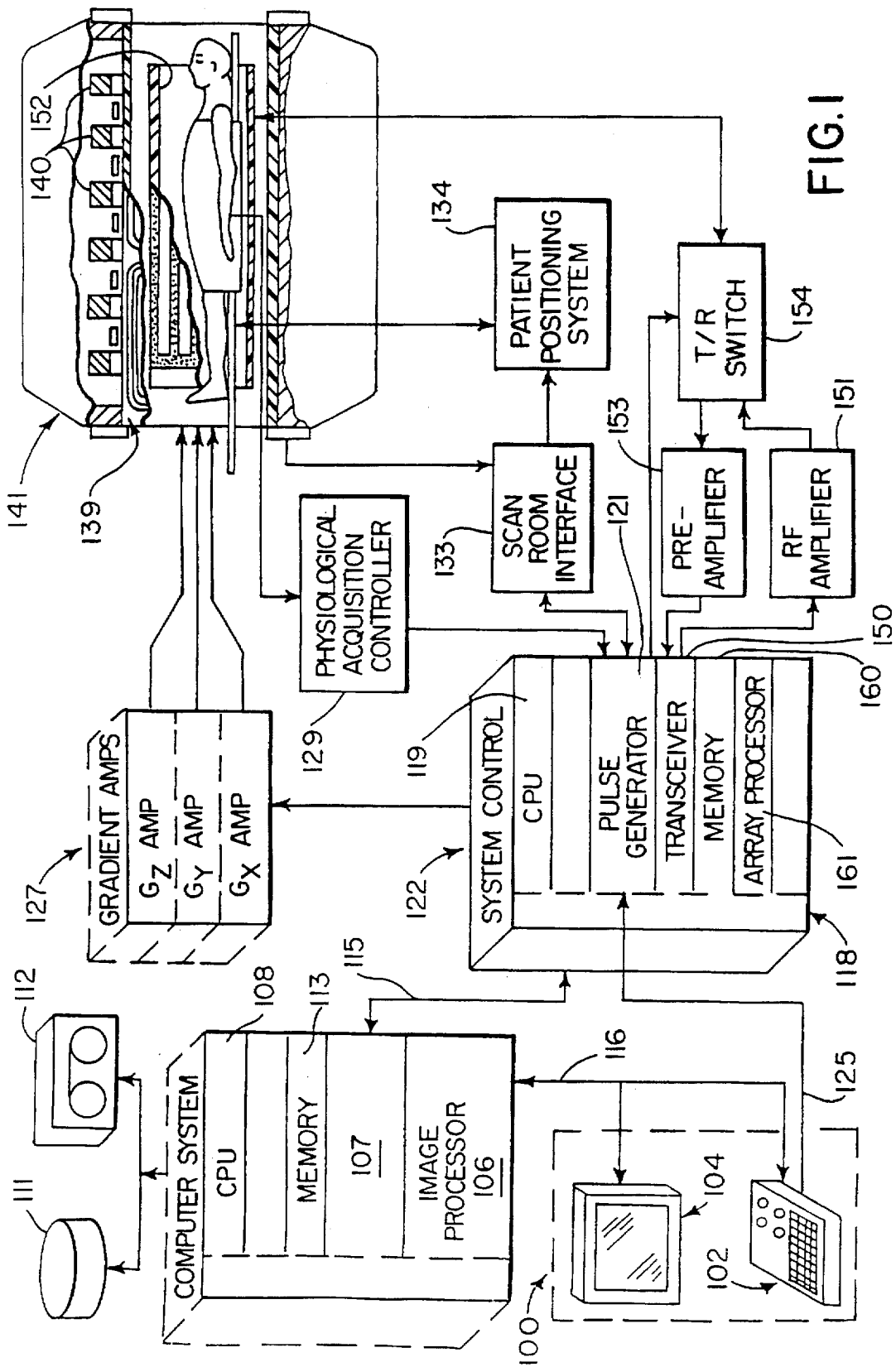
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
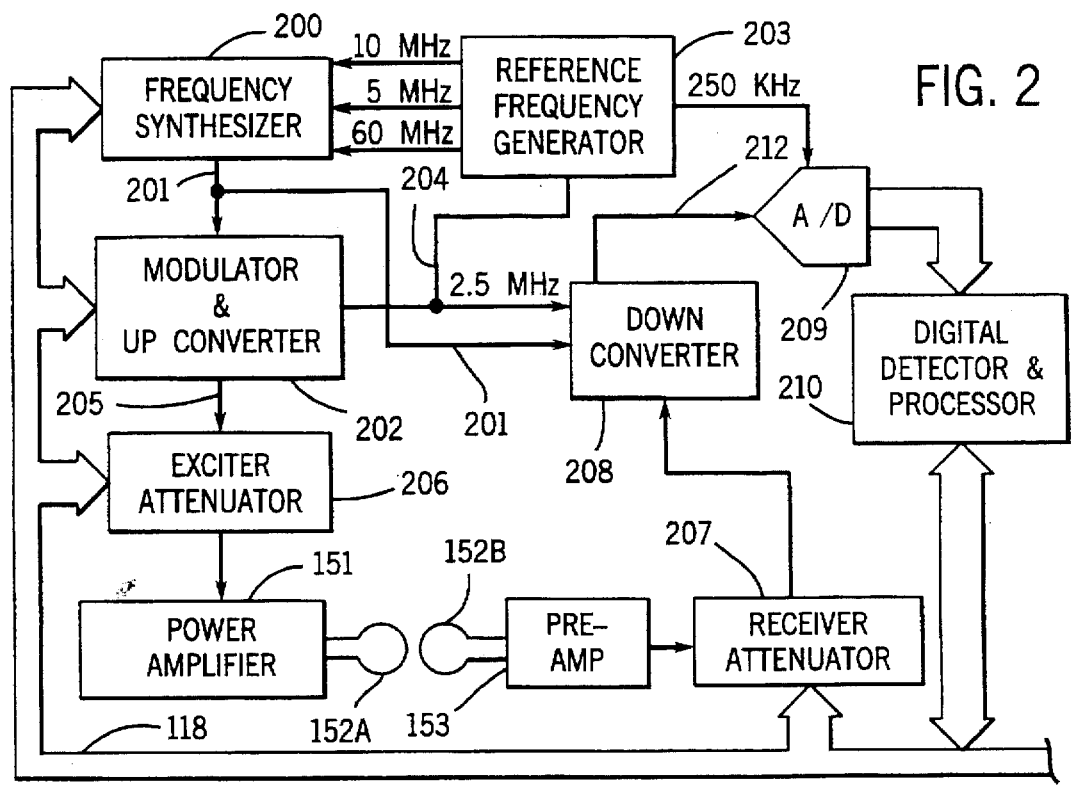
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
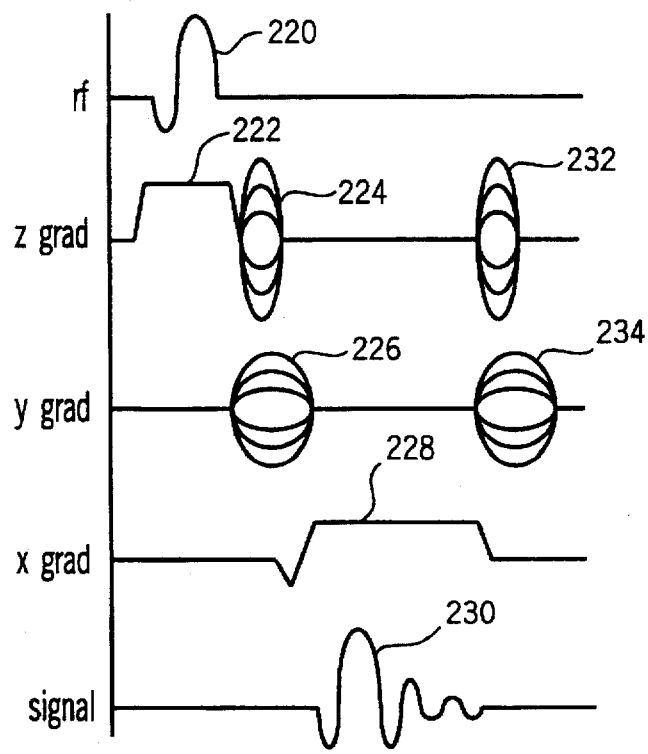
FIG. 3 is a graphic representation of the pulse sequence employed in the preferred embodiment of the invention.

Although the present invention can be used with a number of different pulse sequences, the preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" with revision level 5.5 system software was used. It was modified to collect data from multiple volumes so that the k-space sampling patterns taught by the present invention can be practiced.

Referring particularly to FIG. 3, an RF excitation pulse 220 having a flip angle of 60° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

Figure 4:
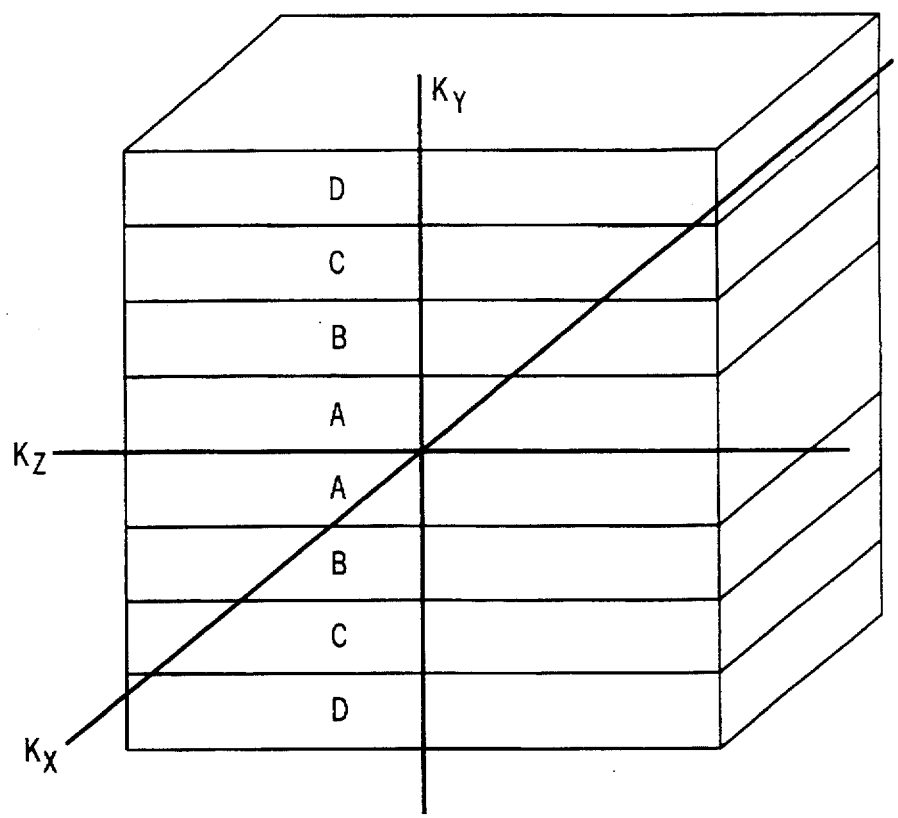
FIG. 4 is a graphic representation of three-dimensional k-space from which data is sampled when practicing the preferred embodiment of the invention.

As is well known in the art, the pulse sequence is repeated and the phase encoding pulses 224 and 226 are stepped through a series of values to sample the 3D k-space depicted in FIG. 4. In the preferred embodiment sixteen phase encodings are employed along the z axis and 128 phase encodings are employed along the y axis. For each particular y phase encoding, therefore, sixteen acquisitions with twelve different z phase encodings are performed to sample completely along the $k_z$ axis. This is repeated 128 times with 128 different y phase encodings to sample completely along the $k_y$ axis. As will become apparent from the discussion below, the order in which this sampling is performed is an important aspect of the present invention.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

Referring particularly to FIG. 4, to perform a dynamic study according to the present invention the k-space to be sampled is divided into regions. In the preferred embodiment the 3D k-space is divided into four regions designated "A–D". The boundaries of these regions A–D are disposed along the $k_y$ axis and are symmetrical about $k_y=0$. A central region "A" occupies the central k-space region ranging from $k_y=-16$ to +15, and as is well known in the art, these "central" samples contain most of the information which determines the overall contrast in the reconstructed image. As will now be described, it is this central k-space region A which forms the basis for each frame image in the dynamic study and which determine the eventual temporal frame rate.

The remaining three "peripheral" k-space regions B–D are divided and disposed on opposite sides of the central region A. They occupy k-space over the following ranges:

Region B—$k_y=-17$ to $-32$ and $+16$ to $+31$

Region C—$k_y=-33$ to $-48$ and $+32$ to $+47$

Region D—$k_y=-49$ to $-64$ and $+48$ to $+63$.

It is an important teaching of the present invention that the central region of k-space be sampled at a higher rate than the peripheral regions during the dynamic study. In the preferred embodiment this is achieved by alternately sampling the central region A and sequential ones of the peripheral regions B–D. Either of the following sampling sequences are thus performed during the dynamic study:

AB AC AD AB AC AD AB AC AD . . .

AD AC AB AD AC AB AD AC AB . . .

Figure 5:
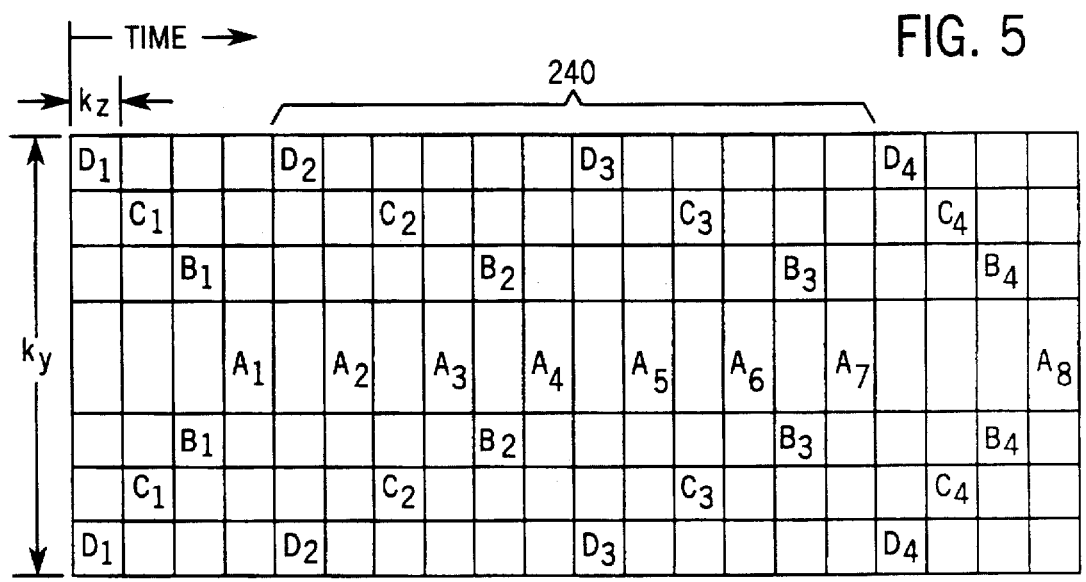
FIG. 5 is a graphic representation of the order in which the three-dimensional k-space of FIG. 4 is sampled.

This latter sampling sequence is shown graphically in FIG. 5, where the horizontal axis indicates real time during the dynamic study and the vertical axis is the region in k-space along the $k_y$ axis that is being sampled. The time periods during which each k-space region A–D is sampled are labelled, and the subscripts indicate the number of times the region has been sampled during the dynamic study. It is readily apparent that the central k-space region A is sampled at a higher temporal rate than the peripheral k-space regions B–D.

In this embodiment all of the regions A–D are scanned at the beginning and again at the end of the dynamic study in order to implement other reconstruction strategies to be discussed below. It can be appreciated that the alternating sequence described above is then performed during the critical time period of the dynamic study indicated at 240. This alternating sequence can be extended as long as necessary to encompass the contrast changes of interest that occur during the particular study.

It can be appreciated by those skilled in the art that k-space can be carved up in other ways to practice the present invention. For example, the number of regions can be changed and they can be oriented such that their boundaries are disposed along the slice-select $k_z$ axis. Also, k-space can be divided into a circular central region and a plurality of surrounding, annular-shaped peripheral regions.

Figure 6:
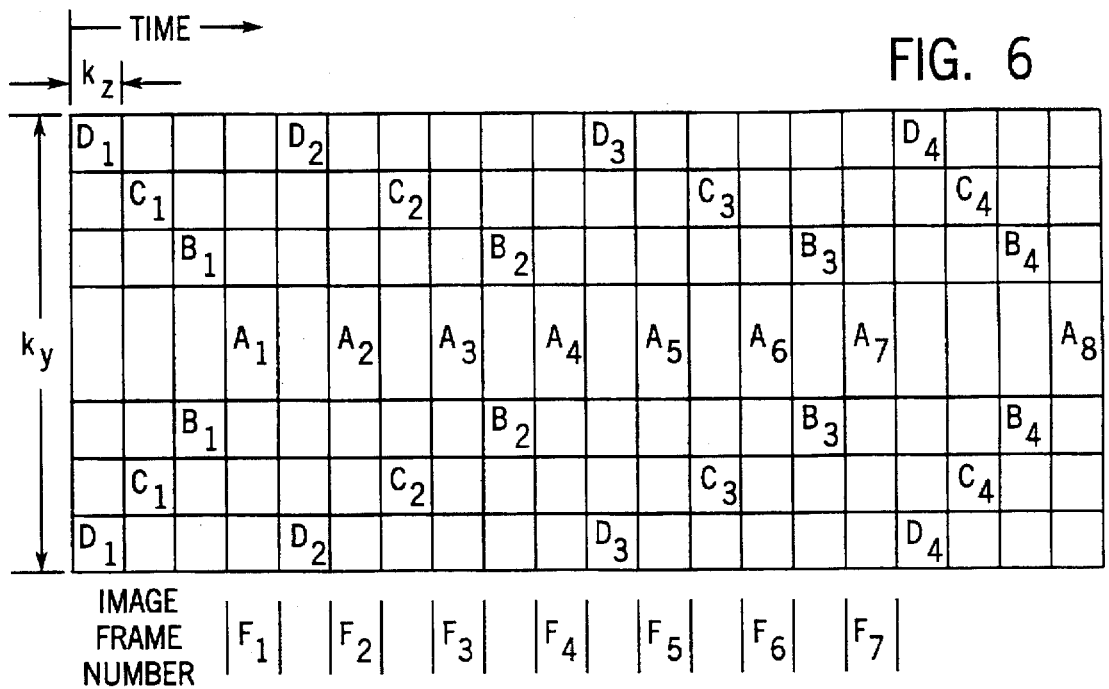
FIG. 6 is a graphic representation of the sampling of the three-dimensional k-space of FIG. 4 showing the times at which each image frame in the dynamic study is reconstructed according to one embodiment of the invention.

The data acquired during the dynamic study can be used in a number of ways to reconstruct a series of frame images $F_1-F_n$ that depict contrast changes occurring during the dynamic study. In one embodiment illustrated in FIG. 6, image frames designated $F_1$ through $F_7$ are reconstructed using data from each central k-space region acquisition ($A_1-A_7$). This is accomplished by forming a data set sufficient to reconstruct a frame image using the particular central k-space region data combined with temporally adjacent data from the surrounding, peripheral k-space regions B–D. Each image frame data set depicts the subject at a particular time during the dynamic study.

One method for forming each such image frame data set is to use the data acquired from peripheral regions closest in time to the acquisition of the central k-space region A. For frame images $F_2$ through $F_6$ the data acquired and depicted in FIG. 6 may thus be formed into data sets as follows:

$$F_2 \rightarrow A_2+B_2+C_2+D_2$$

$$F_3 \rightarrow A_3+B_2+C_2+(D_2 \text{ or } D_3)$$

$$F_4 \rightarrow A_4+B_2+(C_2 \text{ or } C_3)+D_3$$

$$F_5 \rightarrow A_5+(B_2 \text{ or } B_3)+C_3+D_3$$

$$F_6 \rightarrow A_6+B_3+C_3+(D_3 \text{ or } D_4)$$

This method of selecting the data closest in time to that of the image frame is referred to herein as the "nearest neighbor" method. It can be appreciated that sometimes the nearest data for a peripheral region of k-space is close to the frame time, and in other cases the frame time is midway between two sample periods.

Another method for forming a data set at each frame $F_2$ through $F_6$ is to interpolate between the two adjacent sets of data acquired for each peripheral region. A linear interpolation method for forming frame images $F_2$ through $F_6$ from the data acquired and depicted in FIG. 6, for example is as follows:

$$F_2 \rightarrow A_2+(B_1+B_2)/2+(4C_2+C_1)/5+(5D_2+D_3)/6$$

$$F_3 \rightarrow A_3+(5B_2+B_1)/6+(5C_2+C_3)/6+(D_2+D_3)/2$$

$$F_4 \rightarrow A_4+(5B_2+B_3)/6+(C_2+C_3)/2+(5D_3+D_2)/6$$

$$F_5 \rightarrow A_5+(B_2+B_3)/2+(5C_3+C_2)/6+(5D_3+D_4)/6$$

$$F_6 \rightarrow A_6+(5B_3+B_2)/6+(4C_3+C_4)/5+(D_3+D_4)/2$$

Non-linear interpolation can also be used. For example, if a function indicative of the flow of contrast agent into the region of interest during the dynamic study is determined, this function can be used to weight the sampling done at different times during the study.

In the above-described method for forming data sets from which image frames can be reconstructed, one data set is formed for each sampling of the central region of k-space. Additional image frames can be reconstructed, however, to further increase the temporal resolution of the dynamic study by further interpolation of the acquired data. One method is to simply interpolate between the complete data sets $F_2$–$F_6$ formed as described above. This produces the following additional data sets from which further image frames can be reconstructed:

$$F_{2.5}=(F_2+F_3)/2$$

$$F_{3.5}=(F_3+F_4)/2$$

$$F_{4.5}=(F_4+F_5)/2$$

$$F_{5.5}=(F_5+F_6)/2$$

Figure 7:
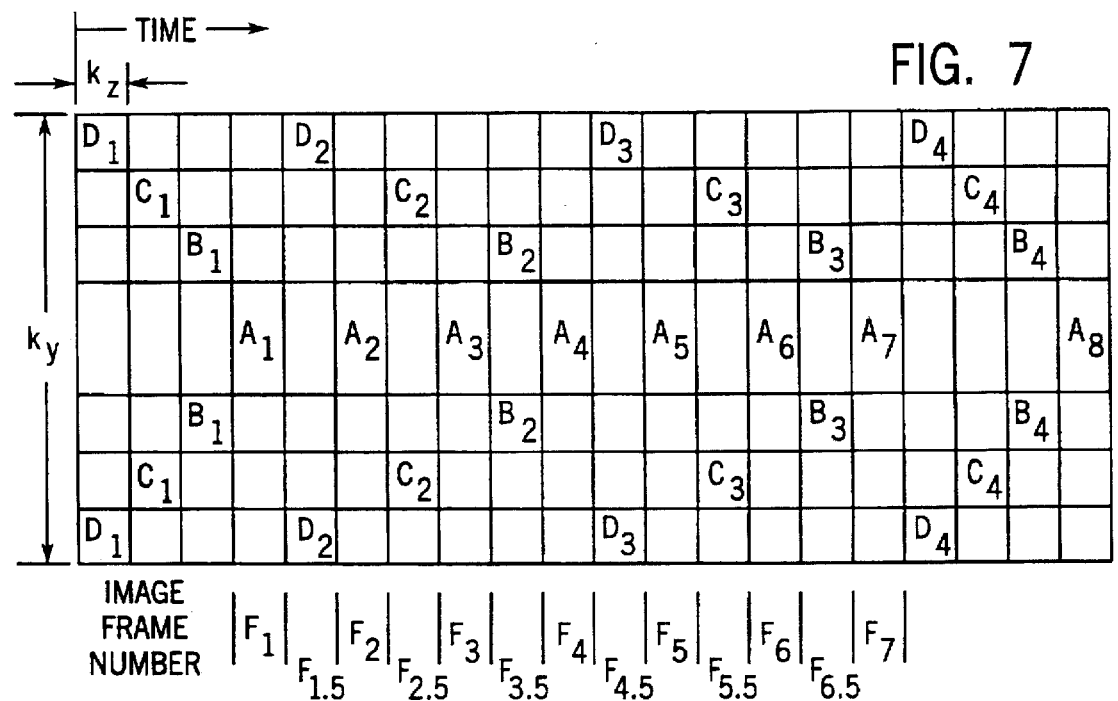
FIG. 7 is a graphic representation of the sampling of the three-dimensional k-space of FIG. 4 showing the times at which each image frame in the dynamic study is reconstructed according to a second embodiment of the invention.

However, the preferred method is to completely form the additional, intermediate image frame data sets directly from the acquired sample data. Referring particularly to FIG. 7, this is achieved by interpolating between successive sample data for the central k-space region and interpolating between the successive the peripheral k-space region samples. These intermediate data sets may thus be formed as follows:

$$F_{1.5} \rightarrow I_{1.5}(A_1,A_2)+I_{1.5}(B_1,B_2)+I_{1.5}(C_1,C_2)+D_2$$

$$F_{2.5} \rightarrow I_{2.5}(A_2,A_3)+I_{2.5}(B_1,B_2)+C_2+I_{2.5}(D_2,D_3)$$

$$F_{3.5} \rightarrow I_{3.5}(A_3,A_3)+B_2+I_{3.5}(D_2,D_3)$$

$$F_{4.5} \rightarrow I_{4.5}(A_4,A_5)+I_{4.5}(B_2,B_3)+I_{4.5}(C_2,C_3)+D_3$$

$$F_{5.5} \rightarrow I_{5.5}(A_5,A_6)+I_{5.5}(B_2,B_3)+C_3+I_{5.5}(D_3,D_4)$$

$$F_{6.5} \rightarrow I_{6.5}(A_6,A_7)+B_3+I_{6.5}(C_3,C_4)+I_{6.5}(D_3,D_4).$$

where "I" is the interpolation method used to calculate the k-space sample data at the desired frame time from the corresponding temporally adjacent k-space samples.

Regardless of how they are formed, the image frame data sets are employed to reconstruct a corresponding set of 3D frame images. In the preferred embodiment a three-dimensional Fourier transformation method is used to reconstruct each 3D frame image. Six such 3D frame images are shown in FIG. 8 as frame image data sets 250–255. A number of different procedures can be used to produce useful diagnostic images from these frame image data sets 250–255.

While images may be produced simply by selecting a set of data points located in a cross section through one of the 3D data arrays 250–255, such images have limited diagnostic value. This is because blood vessels usually do not lie in a single plane and such cross sectional images show only short pieces or cross sections of many vessels that happen to pass through the selected plane. Such images are useful when a specific location in a specific vessel is to be examined, but they are less useful as a means for examining the health of the vascular system and identifying regions that may be diseased.

For assessing overall blood vessel structure and health it is more useful to project the 3D array of NMR data into a single 2D projection image to produce an angiogram-like picture of the vascular system. The most commonly used technique for doing this is to project a ray from each pixel in the projection image through the array of data points and select the data point which has the maximum value. The value selected for each ray is used to control the brightness of its corresponding pixel in the projection image. This method, referred to hereinafter as the "maximum pixel technique," is very easy to implement and it gives aesthetically pleasing images. It is presently the preferred method.

Another technique which is used to form a projection image and which retains more of the available information is what is referred to hereinafter as the "integration method". This projection method is described in U.S. Pat. No. 5,204,627 entitled "Adaptive NMR Angiographic Projection Method" is used and is incorporated herein by reference. With this method the brightness of each projection image pixel is determined by the sum of all the data points along the projection ray.

Yet another technique used to produce projection images uses a 3D region-growing method. The origins of the regions in the 3D data set to be grown are operator determined. The grown regions are then blurred and thresholded to create a mask which includes voxels just outside the vessel edges, which may have been omitted in the region-growing process. This method gives a very smooth representation of the vasculature in which vessel edges are retained and vessel overlap can be deduced by use of visual cues which are included in the rendering process.

The 2D projection images from each 3D image frame data set 250–255 is shown in FIG. 8 at 260–265. These may be viewed directly and used to observe the flow of contrast agent into the subject vasculature over the time course of the dynamic study. In some instances, one or more of the 2D projection images 260–265 may suffice to make a diagnosis.

If a definitive diagnosis cannot be made from the 2D projection images 260–265, a difference projection image can be produced to provide further diagnostic information. As shown in FIG. 8, this is achieved by selecting two of the 3D image frame data sets 250–255 and calculating the difference between their corresponding pixel values. A 3D difference image is produced as indicated by data set 270 and this is then used to produce a 2D difference projection image 272 using the same projection method described above. The selection of two 3D image frame data sets 250–255 is made by the diagnostician to enhance the image contrast in the particular vasculature of interest. Since it is difficult to predict exactly when the peak contrast agent flow will occur through the subject vasculature, the series of 3D image frames provides a time range during which this event should occur.

It will be apparent to those skilled in the art that a number of further techniques can be used to increase image quality and increase the temporal resolution. In the preferred embodiment, a temporal resolution of one frame image each 2 seconds is achieved. This can be increased further by using the above-described real-space keyhole imaging method in those cases where the dynamic part of the image occupies less than one half the entire field of view. Referring to FIG. 5, the complete scans (i.e. D, C, B, A) performed prior to and after the time critical period 240 may be used to produce reference images that are used to implement these methods.

Additionally, if motion of the subject during the dynamic study is minimal, a number of temporal processing methods can be used on the image frame data sets as is done with digital substraction angiography. Mask mode subtraction, simple matched filtering and Eigen filtering, can be used to obtain composite images. These composite images generally have an increased SNR or negligible venous signal.

There are several reasons why image subtraction and other temporal processing techniques are useful. When multiple injections are done, the non-vascular background becomes very bright, lowering vessel to background contrast. Subtraction of an early frame prior to vascular opacification will remove the background. Subtraction is also useful for creating additional opportunities to obtain images where veins and arteries display separately. Often a late image, containing only veins, can be subtracted from an earlier image in which the arterial signal is superimposed on the venous signal, creating an arterial image.

When a temporal series of images is available, various matched filters and Eigen filters can be applied. A matched filter combines several of the images in the series to obtain an image containing improved signal to noise ratio. The images are weighted in the matched filter sum so as to maximize SNR. Eigen filters use a particular set of weighting coefficients such that venous signal is removed from the summed image. This technique requires the measurement of signal within a venous ROI to determine the required coefficients.

We claim:

1. A method for acquiring NMR data from a subject after injection of a contrast agent to produce a series of frame images depicting the passage of contrast agent through a region of interest in the subject by repeatedly acquiring samples from a corresponding k-space during a dynamic study of the subject, the steps comprising:

sampling a central region of k-space at intervals during the dynamic study at a selected temporal rate;

sampling peripheral regions of k-space at intervals during the dynamic study at a lower temporal rate;

producing a series of data sets by forming a data set for each central region k-space sampling, which includes said central region k-space samples and samples derived from temporally adjacent samplings of the peripheral k-space regions; and reconstructing the series of frame images from the series of data sets.

2. The method as recited in claim 1 in which the NMR data is acquired from a three-dimensional region of the subject.

3. The method as recited in claim 2 in which a three-dimensional frame image is produced from one of said data sets.

4. The method as recited in claim 3 in which a two-dimensional image is produced by projecting said three-dimensional frame image.

5. A method for acquiring NMR data from a subject to produce a series of frame images by repeatedly acquiring samples from a selected k-space during a dynamic study of a three-dimensional region of the subject, the steps comprising:

sampling a central region of the selected k-space at a temporal rate;

sampling peripheral regions of the selected k-space at a lower temporal rate;

forming a data set for each set of central region k-space samples, which includes said central region k-space samples and samples derived from the most temporally adjacent samplings of the peripheral k-space regions; and reconstructing a three-dimensional frame image from each data set, and;

in which a further three-dimensional image is produced by subtracting one of said three-dimensional frame images from another one of said three-dimensional frame images.

6. The method as recited in claim 5 in which a two-dimensional image is produced by projecting the further three-dimensional image.

7. The method as recited in claim 1 in which the samples derived from the temporally adjacent samplings of the peripheral k-space regions are derived by selecting the temporally nearest samples of the peripheral k-space regions.

8. The method as recited in claim 1 in which the samples derived from the temporally adjacent samplings of the peripheral k-space regions are derived by interpolating between the two temporally nearest samples of the peripheral k-space regions.

9. The method as recited in claim 8 in which the interpolation is linear interpolation.

10. A method for acquiring NMR data from a subject to produce a series of frame images by repeatedly acquiring samples from a selected k-space during a dynamic study of the subject, the steps comprising:

sampling a central region of the selected k-space at a temporal rate;

sampling peripheral regions of the selected k-space at a lower temporal rate;

forming a data set for each set of central region k-space samples, which includes said central region k-space samples and samples derived from the most temporally adjacent samplings of the peripheral k-space regions; and reconstructing a frame image from each data set; and in which there are three different peripheral k-space regions and the k-space is repeatedly sampled during the dynamic study by alternately sampling the central k-space region and one of the three different peripheral k-space regions.

11. The method as recited in claim 1 in which additional data sets are formed by interpolating between successive data sets, and additional frame images are reconstructed from said additional data sets.

12. The method as recited in claim 1 in which additional data sets are formed by interpolating between successive samplings of the central k-space region, and additional frame images are reconstructed from said additional data sets.

13. The method as recited in claim 12 in which the additional data sets are formed by also interpolating between the two temporally nearest samples of the peripheral k-space regions.

14. The method as recited in claim 12 in which the additional data sets are formed by also deriving samples from the most temporally adjacent samplings of the peripheral k-space regions by selecting the temporally nearest samples of the peripheral k-space regions.

15. The method as recited in claim 1 in which there are a plurality of different peripheral regions of k-space and each different peripheral region of k-space is sampled at a different temporal rate during the dynamic study.

16. The method as recited in claim 1 in which each frame image is reconstructed by subtracting one of the data sets from each of the other data sets in the series and performing a Fourier transformation on each of said other subtracted data sets.

17. The method as recited in claim 16 in which each of the other subtracted and transformed data sets is a two-dimensional data set, and a two-dimensional image is produced by projecting on eof said subjected and transformed three-dimensional data sets.

18. The method as recited in claim 1 in which each frame image is reconstructed by Fourier transforming each data set and then subtracting one of said transformed data sets from each ofhter of the other transformed data sets.

19. The method as recited in claim 18 in which the subtracted and transformed data sets are three-dimensional data sets, and a two-imdensional image is produced by projecting one of said subtracted and transformed three-dimensional data sets.

20. The method as recited in claim 1 in which the central region of k-space is a substantially circular central region of k-space and the peripheral regions are surrounding annular-shaped regions of k-space.

21. The method as recited in claim 1 in which the regions divide k-space along a phase encoding axis.

22. The method as recited in claim 1 in which the central region of k-space is substantially symmetrically centered about a plane defined by the readout and slice encoding axes.

23. The method as recited in claim 12 in which the additional data sets are formed by selecting the temporally nearest samples of the peripheral k-space regions.

* * * * *